United States Patent
Mangum et al.

(10) Patent No.: US 11,088,302 B2
(45) Date of Patent: Aug. 10, 2021

(54) LIGHT-EMITTING DEVICE

(71) Applicant: OSRAM Opto Semiconductors GmbH, Regensburg (DE)

(72) Inventors: Benjamin Daniel Mangum, Tualatin, OR (US); David O'Brien, Portland, OR (US); Britta Göötz, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 41 days.

(21) Appl. No.: 16/504,845

(22) Filed: Jul. 8, 2019

(65) Prior Publication Data

US 2021/0013381 A1    Jan. 14, 2021

(51) Int. Cl.
| | |
|---|---|
| *H01L 33/50* | (2010.01) |
| *C09K 11/08* | (2006.01) |
| *G02F 1/13357* | (2006.01) |
| *G09F 9/33* | (2006.01) |
| *H01L 27/15* | (2006.01) |

(Continued)

(52) U.S. Cl.
CPC ........ *H01L 33/504* (2013.01); *C09K 11/0883* (2013.01); *G02F 1/133603* (2013.01); *G09F 9/33* (2013.01); *H01L 27/156* (2013.01); *H01L 33/52* (2013.01); *H05B 33/14* (2013.01); *B82Y 20/00* (2013.01); *B82Y 30/00* (2013.01); *C01P 2004/62* (2013.01); *C01P 2004/64* (2013.01); *F21Y 2115/10* (2016.08); *G02F 1/133614* (2021.01)

(58) Field of Classification Search
CPC ..... H01L 33/504; H01L 27/156; H01L 33/52; G02F 1/133603; G02F 2001/133614; H05B 33/14; C09K 11/0883; G09F 9/33; F21Y 2115/10; C01P 2004/64; C01P 2004/62; B82Y 30/00; B82Y 20/00
See application file for complete search history.

(56) References Cited

U.S. PATENT DOCUMENTS 10,732,332 B2    8/2020    Uto et al.
2014/0367633 A1    12/2014    Bibl et al.
(Continued)

FOREIGN PATENT DOCUMENTS

| DE | 102018108875 A1 | 10/2019 |
|---|---|---|
| WO | 2019099833 A1 | 5/2019 |
| WO | WO2018083953 A1 | 9/2019 |

OTHER PUBLICATIONS

Stillman, G., et al., "III-V Compound Semiconductor Devices: Optical Detectors," IEEE Transactions on Electron Devices, vol. 31, No. 11, Nov. 1984, pp. 1643-1655.

*Primary Examiner* — Karen Kusumakar
*Assistant Examiner* — Adam S Bowen
(74) *Attorney, Agent, or Firm* — Slater Matsil, LLP

(57) ABSTRACT

A light emitting device is disclosed. In an embodiment a light-emitting device includes a pixel comprising at least three sub-pixels, wherein a first sub-pixel includes a first conversion element having a green phosphor, wherein a second sub-pixel includes a second conversion element having a red phosphor and wherein a third sub-pixel is free of a conversion element, the third sub-pixel configured to emit blue primary radiation, wherein each sub-pixel has an edge length of at most 100 μm, and wherein the light-emitting device is configured to enhance a gamut coverage of an emitted radiation.

20 Claims, 4 Drawing Sheets

(51) Int. Cl.
  *H01L 33/52* (2010.01)
  *H05B 33/14* (2006.01)
  *F21Y 115/10* (2016.01)
  *G02F 1/1335* (2006.01)
  *B82Y 20/00* (2011.01)
  *B82Y 30/00* (2011.01)

(56) References Cited

U.S. PATENT DOCUMENTS

| | | | |
|---|---|---|---|
| 2015/0189196 A1* | 7/2015 | Bessho | H01L 27/14625 |
| | | | 252/519.3 |
| 2015/0362165 A1 | 12/2015 | Chu et al. | |
| 2017/0029697 A1 | 2/2017 | Ghosh et al. | |
| 2017/0250323 A1* | 8/2017 | Otto | H01L 25/0753 |
| 2018/0357948 A1 | 12/2018 | Chen et al. | |
| 2019/0041699 A1* | 2/2019 | David | G02F 1/133617 |

\* cited by examiner

LIGHT-EMITTING DEVICE

TECHNICAL FIELD

The invention relates to a light-emitting device.

SUMMARY

Embodiments provide a light-emitting device with small pixel sizes and a high color gamut.

According to one embodiment, a light-emitting device is provided. The light-emitting device is configured or designed to emit electromagnetic radiation during operation of the device. For example, the light-emitting device is a light-emitting diode (LED).

According to one embodiment, the light-emitting device comprises a pixel comprising at least three sub-pixels.

Each of the sub-pixels is designed or configured to emit radiation, in particular, in the visible spectral range.

The pixel can comprise sub-pixels that are individual light-emitting diodes or the pixel can comprise one light-emitting diode structured into at least three individual parts with each part forming a sub-pixel. The sub-pixels are operable independently from each other.

Each light-emitting diode or each part of the light-emitting diode can emit a primary radiation, in particular a blue primary radiation.

The individual sub-pixels can be arranged within the pixel without restriction to a specific order. In other words, each sub-pixel can be arranged adjacent to any other sub-pixel in any two-dimensional geometric order. In particular, at least one edge of a sub-pixel is arranged adjacently to an edge of another sub-pixel within the pixel.

According to one embodiment, the light-emitting device comprises a first sub-pixel comprising a first conversion element, wherein the first conversion element comprises a green phosphor. In particular, the first conversion element consists of a green phosphor. A green phosphor is a phosphor that can be used for converting the wavelength of a primary radiation into a secondary radiation in the green wavelength range. In particular, the green phosphor converts blue primary radiation into green secondary radiation. Thus, the first sub-pixel comprising the first conversion element emits green light during operation.

Here and in the following, "wavelength conversion" means that primary radiation of a first wavelength range is converted in secondary radiation of a second wavelength range which comprises preferably longer wavelengths than the primary radiation. In general, wavelength converting phosphors absorb primary radiation, convert the absorbed radiation at least partially, preferably completely, in secondary radiation of the second wavelength range by a molecular and/or atomic mechanism and reemit the converted radiation. In particular, scattering or absorption alone is not meant with wavelength conversion in this context.

According to one embodiment, the light-emitting device comprises a second sub-pixel comprising a second conversion element, wherein the second conversion element comprises a red phosphor. In particular, the second conversion element consists of a red phosphor. A red phosphor is a phosphor that can be used for converting the wavelength of a primary radiation into a secondary radiation in the red wavelength range. In particular, the red phosphor converts blue primary radiation into red secondary radiation. Thus, the second sub-pixel comprising the second conversion element emits red light during operation.

According to one embodiment, the light-emitting device comprises a third sub-pixel which is free of a conversion element, wherein the third sub-pixel is configured to emit blue primary radiation. In particular, the third sub-pixel emits the primary radiation of the light-emitting diode which forms the third sub-pixel. "Free of a conversion element" means that no wavelength converting phosphor is arranged on the radiation emission surface of the light-emitting diode forming the third sub-pixel.

According to one embodiment, the sub-pixels each have an edge length of at most 100 µm, in particular of at most 10 µm and preferably of at most 5 µm. The sub-pixels can be square and thus, each edge may have the same length. The sub-pixel are, however, not necessarily rectangular and can have any form or shape. The edge length then refers to the extension of the sub-pixel in an extension direction of the pixel.

According to one embodiment, the light-emitting device comprises means for enhancing the gamut coverage of the emitted radiation. The gamut or color gamut refers to the subset of colors that can be accurately represented under given circumstances like a given color space or by a light-emitting device. The gamut of a light-emitting device in a CIE 1931 chromaticity diagram is typically triangular. The corners of the triangle are the primary colors for the gamut, for example, blue, green and red. The gamut of a light-emitting device can be expressed as a percentage of given standards such as Rec2020 or sRGB. This percentage is called the gamut coverage of the light-emitting device. Alternatively, the gamut coverage of a light-emitting device can refer to the percentage of the maximum gamut of this device under ideal circumstances.

The invertors found that reduction of color contamination from crosstalk between adjacent sub-pixels and unwanted transmission of primary radiation through a conversion element are key aspects for enhancing the gamut coverage, in particular for small sub-pixels.

"Crosstalk" refers to an unwanted emission of radiation due to the absorption and conversion of radiation from adjacent sub-pixels by a conversion element. For example, blue primary radiation of the third sub-pixel is coupled into the first and/or second conversion elements and absorbed and converted by the green and/or red phosphors leading to an unwanted emission of green and/or red radiation. Equally, green radiation generated in the first conversion element can be coupled into the second conversion element and be absorbed and converted by the red phosphor leading to an unwanted emission of red radiation.

For larger sub-pixel sizes of around 100 µm, decreasing the thickness of the conversion element to around 15 µm can reduce the crosstalk. To sufficiently reduce crosstalk for significantly smaller pixel sizes, for example, of at most 10 µm, or to further reduce the crosstalk for sub-pixels of at most 100 µm, the thicknesses of the conversion elements need to be as thin as possible. Thin conversion elements reduce crosstalk, but can increase the unwanted transmission of primary radiation through the conversion element.

"Unwanted transmission of primary radiation through a conversion element" can be caused by reducing the thicknesses of the conversion elements to reduce the crosstalk between adjacent sub-pixels. A thin conversion element can reduce the absorption of primary radiation and thus prevent full conversion. Anything less than 100% absorption of primary radiation leads to some unwanted transmission of primary radiation which reduces the color-purity of the sub-pixel and thus the gamut coverage of the light-emitting device.

Therefore, the primary consideration for achieving a large color gamut is to have the color of each sub-pixel have the highest color-purity possible as well as a minimum of crosstalk between adjacent sub-pixels. For maximum gamut coverage, it is also beneficial to have a color location of each of the sub-pixels as close to the spectral locus as possible. Thus, means to enhance the gamut coverage are the increase of color-purity, the reduction of unwanted transmission of primary radiation and/or the reduction of crosstalk.

According to one embodiment, the light-emitting device comprises a pixel comprising at least three sub-pixels, a first sub-pixel comprising a first conversion element, wherein the first conversion element comprises a green phosphor, a second sub-pixel comprising a second conversion element, wherein the second conversion element comprises a red phosphor, a third sub-pixel which is free of a conversion element, wherein the third sub-pixel is configured to emit blue primary radiation, wherein the sub-pixels each have an edge length of at most 100 μm, and wherein the light-emitting device comprises means for enhancing the gamut coverage of the emitted radiation.

Such a light-emitting device has an increased color gamut and can cover a high percentage of the color gamut of common standards such as Rec2020 or sRGB. The light-emitting device has a good color rendering due to a reduction of inadvertent color contamination of sub-pixels in tightly packed RGB (red green blue) arrays for visualization with small sub-pixels.

It should be noted, that the number of first, second and third sub-pixels within the pixel not necessarily has to be equal although each light-emitting device at least comprises one first, one second, and one third sub-pixel. Instead, the numbers can be different to account for different ratio of first:second:third sub-pixels as it is sometimes desired. For example, a higher amount of first sub-pixels then second and/or third sub-pixels can enhance the efficiency of the light-emitting device, since green phosphors can have a smaller conversion efficiency than red phosphors.

According to one embodiment, the red phosphor and/or the green phosphor comprises quantum dots. Quantum dots can comprise or consist of at least one semiconductor material. Each quantum dot, for example, comprises a core comprising a first semiconductor material and, optionally, at least one shell comprising a second different semiconductor material with the shell at least partly, preferably completely, surrounding the core. The semiconductor materials, for example, comprise or consist of group II-VI, group III-V, group IV-VI, group I-III-VI and group II-IV-VI semiconductors as well as alloys or mixtures thereof, in particular CdSe, InAs, ZnSe, InP, GaP, CdS, ZnS, HgTe, PbSe, PbS as well as ternary and doped materials such as $CuInS_2$ as well as alloys or mixtures thereof. The quantum dots can be spherical or rod-shaped and have a diameter between 2 nm inclusive and 20 nm inclusive, for example, 9×12 nm for a rod-shaped quantum dot.

The quantum dots can be encapsulated in an encapsulation material. The encapsulation material can surround a multiplicity of quantum dots or encapsulate each quantum dot individually. For individually encapsulated quantum dots, the diameter is, for example, 10 nm-60 nm. The encapsulation material of the quantum dots can act as a binder for the conversion element, effectively binding the quantum dots into a densely packed layer without an additional matrix material.

Quantum dots can be formed to show a high absorption of primary radiation, in particular of blue primary radiation, as well as a high quantum yield. For very small sub-pixels, for example, with edge length of at most 10 μm, in particular of at most 5 μm, quantum dots are preferred for wavelength conversion. Quantum dots can form densely packed layers and can thus significantly reduce the thickness of conversion elements while still providing good conversion efficiency and reducing crosstalk.

As quantum dots are semiconductors with large refractive indices, densely packed conversion elements have the effect of raising the refractive indices of the conversion elements to a similar refractive index as the LED semiconductor. This can encourage the coupling of blue primary radiation into the converter and discourage the coupling of radiation that is emitted from the third sub-pixel into the surrounding low refractive into the high refractive index conversion element. This, too, reduces the crosstalk between adjacent sub-pixels and enhances the gamut coverage.

Quantum dots can have narrow linewidths. Narrow linewidths emitters in the conversion elements of sub-pixels lead to a high color-purity of these sub-pixels increasing their color gamut and thus the gamut coverage of the light-emitting device.

According to one embodiment, the first and/or the second conversion element has a thickness of at most 5 μm, in particular of at most 2 μm. For example, the first and/or the second conversion element has a thickness of 1-2 μm or smaller. Since crosstalk is a great problem for small sub-pixels, conversion elements need to be thinner compared to conversion elements for larger sub-pixels. Thin conversion elements can significantly reduce the possibility for crosstalk between sub-pixels and thus increase the gamut coverage of the light-emitting device. Thin conversion elements are, for example, achieved by using quantum dots as a phosphor.

According to one embodiment, the first and/or the second conversion element is free of non-converter nanoparticles. Non-converter nanoparticles are, in most cases, absorptive to incident radiation, but do not convert absorbed radiation into radiation in the visible spectral range. Since non-converter nanoparticles can have a high refractive index, they are, for example, used for better extraction of red radiation. An addition of non-converter nanoparticles into conversion elements can lead to a reduction of the quantum yield of the conversion element and thus to a reduction of color gamut, since non-converter nanoparticles can absorb the primary radiation. Hence, a conversion element free of non-converter nanoparticles can increase the color gamut.

According to one embodiment, an absorption layer is arranged on the first and/or second conversion element, wherein the absorption layer is configured to absorb blue primary radiation. In other words, the absorption layer comprises or consists of a material that absorbs at least partially, preferably completely, the blue radiation that is transmitted through the first and/or second conversion element. In particular, the absorption layer absorbs blue radiation but is transmissive for green and/or red radiation. For example, the absorption layer absorbs at least 90%, in particular 95% and preferably 99% of the blue radiation that is transmitted through the first and/or second conversion element. The absorption layer is in particular arranged in direct mechanical contact to a radiation emission surface of the first and/or second conversion element. Since the absorption layer reduces the unwanted emission of blue radiation from the first and/or second sub-pixel, the color-purity of the first and/or second sub-pixel are increased thus enhancing the gamut coverage of the light-emitting device. The absorption layer does not convert the absorbed blue radiation into visible light.

According to one embodiment, an absorption layer is arranged on the first and/or second conversion element, wherein the absorption layer comprises nanoparticles which are absorptive to blue primary radiation. The nanoparticles comprise or consist of a material that is configured or designed to have a bandgap leading to an absorption of blue radiation but not of red and/or green radiation. In other words, the nanoparticles in the absorption layer absorb at least partially, preferably completely, the blue radiation that is transmitted through the first and/or second conversion element, but are transmissive for green and/or red radiation. For example, the nanoparticles absorbs at least 90%, in particular 95% and preferably 99% of the blue radiation that is transmitted through the first and/or second conversion element. The absorption layer is in particular arranged in direct mechanical contact to the radiation emission surface of the first and/or second conversion element. The reduction of unwanted emission of blue radiation from the first and/or second sub-pixel increases the color-purity of the sub-pixels and thus enhances the gamut coverage of the light-emitting device. The nanoparticles in the absorption layer do not convert the absorbed blue radiation into visible light.

According to one embodiment, the nanoparticles have a diameter of between at least 2 nm and at most 500 nm, in particular of between at least 5 nm and at most 500 nm and preferably of between at least 2 nm and at most 50 nm. The nanoparticles in the absorption layer can lead to a scattering of the radiation emitted from the conversion element, in particular of converted radiation back into the conversion element. Therefore the absorption layer is configured or designed to only have a small scattering effect which can be achieved by small nanoparticles. The smaller the nanoparticles in the absorption layer are, the smaller the scattering effect becomes. Nanoparticles with a diameter of between at least 2 nm and at most 500 nm, for example, lead to less scattering than nanoparticles with diameters above 500 nm. An absorption layer comprising such small nanoparticles increase the quantum yield and thus the gamut coverage of the light-emitting device.

According to one embodiment, the nanoparticles comprise materials selected from binary systems, ternary systems or alloy materials. In particular, the nanoparticles comprise materials that have a bandgap leading to an absorption of blue radiation but not of red and/or green radiation.

Suitable binary systems are, for example, GaP or CdS. GaP nanoparticles can remove blue and green radiation transmitted from a conversion element for generating red radiation since they have a strong absorption for blue radiation and wavelengths up to about 550 nm and a good transmission for red radiation. CdS nanoparticles can absorb blue radiation and transmit green radiation and can therefore remove blue radiation transmitted from a conversion element for generating green radiation. Suitable ternary systems or alloy materials are, for example, $Cd_xZn_{1-x}S$ or $In_xGa_{1-x}P$. $Cd_xZn_{1-x}S$ alloys can be tuned to absorb radiation up to any wavelength between 317 nm and 512 nm. $In_xGa_{1-x}P$ alloys can be tuned to absorb radiation up to any wavelength between 549 nm and 918 nm.

According to one embodiment, the absorption layer has a thickness of at most 2 μm. For example, the absorption layer has a thickness of 1-2 μm. An absorption layer with a thickness of at most 2 μm reduces the crosstalk between adjacent sub-pixels in case of optical scattering advantageously.

According to one embodiment, the red phosphor comprises red quantum dots configured to be minimally absorptive to green radiation. "Minimally absorptive to green radiation" means that the red quantum dots are configured or designed to only have an absorbance in the wavelength range below 550 nm, in particular below 500 nm. In other words the red quantum dots can absorb blue radiation but not green radiation. For example, the absorption of incident radiation at a wavelength of at most 550 nm, preferably of at most 500 nm, is at most 10%, in particular at most 5% and preferably at most 1% of the absorption of incident radiation at a wavelength of 450 nm. A minimal absorbance for green radiation of the red quantum dot is achieved, for example, with carefully picking core and shell materials, core diameters and shell thicknesses as well as the shapes of the quantum dots. According to one embodiment, the red quantum dots comprise a CdSe core and a CdS shell. Red quantum dots that are minimally absorptive to green radiation reduce crosstalk from green to red between adjacent sub-pixels and thus enhance the gamut coverage of the light-emitting device.

According to one embodiment, the pixel is a repeat unit of a two-dimensional ordered pattern. A two-dimensional pattern has a vertical and a horizontal extension direction. The vertical and the horizontal extension directions are orthogonal to each another. An ordered pattern comprises repeat units that are repeated in a regular fashion. In other words, the repeat units can be recognized in the two-dimensional ordered pattern in a vertical and/or a horizontal extension direction. In particular, the order of the sub-pixels in the pixel can be recognized in the vertical and horizontal extension directions of the two-dimensional ordered pattern.

According to one embodiment, the repeat unit of the two-dimensional ordered pattern is a linear chain of sub-pixels. A linear chain of sub-pixels is to be understood as at least three sub-pixels arranged in a one-dimensional linear order. In particular, the chain of sub-pixels is linearly arranged in the vertical or horizontal extension direction of the two-dimensional ordered pattern.

According to one embodiment, a multiplicity of repeat units is arranged in the two-dimensional ordered pattern. Ordering a multiplicity of pixels in a two-dimensional ordered pattern can minimize crosstalk between adjacent sub-pixels and thus maximize color gamut.

According to one embodiment, the multiplicity of repeat units is arranged so that a first sub-pixel is never adjacent to a third sub-pixel in a vertical and in a horizontal extension direction of the two-dimensional ordered pattern. In other words, a green-emitting first sub-pixel is never adjacent to a blue-emitting third sub-pixel. In particular, a green-emitting first sub-pixel is never in direct mechanical contact to a blue-emitting third sub-pixel. Thus a red-emitting second sub-pixel is always arranged between a green-emitting first sub-pixel and a blue-emitting third sub-pixel. Such two-dimensional ordered pattern reduce unwanted crosstalk from blue to green and thus enhance the gamut coverage of the light-emitting device.

According to one embodiment, the repeat unit comprises an equal number n of first, second and third sub-pixels. If n equals two, a repeat unit then comprises a linear chain of two green-emitting first, two red-emitting second and two blue-emitting third sub-pixels. These sub-pixels are arranged, for example, in the order blue-, red-, green-, green-, red- and blue-emitting sub-pixel.

According to one embodiment, the repeat unit comprises an equal number n of second and third sub-pixels and n+1 first sub-pixels. If n equals two, a repeat unit then comprises a linear chain of three green-emitting first, two red-emitting second and two blue-emitting third sub-pixels. These sub-pixels are arranged, for example, in the order blue-, red-, green-, green-, green-, red- and blue-emitting sub-pixel. Since green phosphors can have a smaller conversion efficiency then red phosphors, a higher amount of green-emitting first sub-pixels can enhance the efficiency of the light-emitting device.

Another embodiment of the invention relates to a light-emitting device. Features and embodiments of the light-emitting device described below are also disclosed for the light-emitting device described above and vice versa.

According to one embodiment, the light-emitting device comprises a pixel comprising at least three sub-pixels, a first sub-pixel comprising a first conversion element, wherein the first conversion element comprises a green phosphor, a second sub-pixel comprising a second conversion element, wherein the second conversion element comprises red quantum dots configured to be minimally absorptive to green radiation, and a third sub-pixel which is free of a conversion element, wherein the third sub-pixel is configured to emit blue primary radiation, wherein the sub-pixels each have an edge length of at most 100 µm, and wherein the pixel is a linear chain of sub-pixels and a multiplicity of pixels is arranged in a two dimensional ordered pattern so that a first sub-pixel is never adjacent to a third sub-pixel in a vertical and in a horizontal extension direction of the ordered pattern.

A lighting device with pixels arranged a two-dimensional ordered pattern reduces unwanted crosstalk between adjacent sub-pixels. Crosstalk from blue to green is reduced due to the fact that the blue-emitting third sub-pixels are never adjacent to green-emitting first sub-pixels. Crosstalk from green to red is reduced since the red quantum dots are configured or designed to be minimally absorptive to green radiation. Crosstalk from blue to red is less problematic since red phosphors normally have a high absorption for blue and thus the color-purity of the red sub-pixel is not influenced. Thus, the light-emitting device has a high gamut coverage.

Yet another embodiment of the invention relates to a light-emitting device. Features and embodiments of the light-emitting device described below are also disclosed for the light-emitting devices described above and vice versa.

According to one embodiment, the light-emitting device comprises a pixel comprising at least three sub-pixels, a first sub-pixel comprising a first conversion element, wherein the first conversion element comprises green quantum dots, a second sub-pixel comprising a second conversion element, wherein the second conversion element comprises red quantum dots configured to be minimally absorptive to green radiation, a third sub-pixel which is free of a conversion element, wherein the third sub-pixel is configured to emit blue primary radiation, and an absorption layer arranged on the first and/or second conversion element, wherein the sub-pixels each have an edge length of at most 100 µm, and wherein the first and the second conversion element have a thickness of at most 2 µm.

A light-emitting device comprising conversion elements with a thickness of at most 2 µm in combination with red quantum dots configured or designed to be minimally absorptive to green radiation and an absorption layer arranged on the first and/or second conversion element reduces unwanted crosstalk between adjacent sub-pixels as well as an unwanted transmission of blue primary radiation through the conversion elements. The use of quantum dots in conversion elements for wavelength conversion on small sub-pixels can significantly reduce the thickness of the conversion element compared to conversion elements comprising non-quantum dot phosphors since quantum dots can be densely packed and have a high quantum yield. In addition, the red quantum dots can be configured or designed to be minimally absorptive to green radiation. Thus, crosstalk between adjacent sub-pixels is minimized, but the amount of blue primary radiation transmitted through the conversion elements can be increased. An absorption layer comprising a material that is absorptive to blue radiation but transmissive to green and/or red radiation can reduce the amount of blue radiation transmitted through the conversion elements. The combination of thin conversion elements and the absorption layer reduces the crosstalk as well as the unwanted transmission of primary radiation. Thus, the sub-pixels have a good color-purity and the light-emitting device has a high gamut coverage.

According to one embodiment, the light-emitting device is at least part of a display. "At least part of a display" means that a single light-emitting device can form a display or that at least two, in particular a plurality of light-emitting devices form the display. Light-emitting devices with small pixels can be a part of any display, in particular of displays close to the eye. Such displays are, for example, displays for virtual reality applications, which need tightly packed RGB arrays for visualization with a high color rendering and a high gamut coverage.

BRIEF DESCRIPTION OF THE DRAWINGS

Advantageous embodiments and developments of the optoelectronic device and the method of producing an optoelectronic device will become apparent from the exemplary embodiments described below in association with the figures.

In the figures.

In the exemplary embodiments and figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

DETAILED DESCRIPTION OF ILLUSTRATIVE EMBODIMENTS

Figure 1:
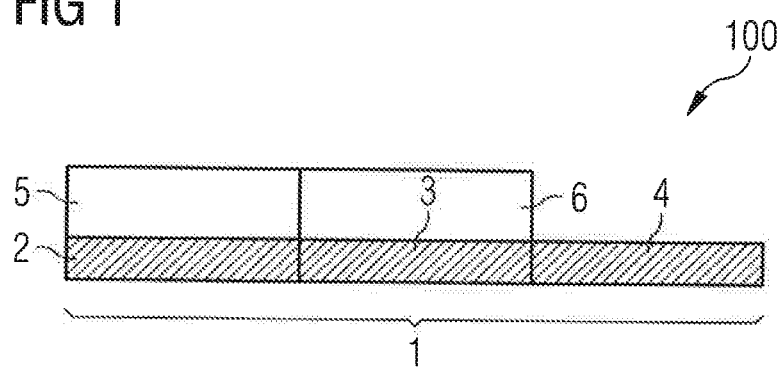
FIGS. 1 and 2 show schematic illustrations of light-emitting devices and/or displays according to different embodiments.

FIG. 1 shows a light-emitting device 100 comprising a pixel 1 comprising at least three sub-pixels 2, 3, 4. Each sub-pixel 2, 3, 4 has an edge length of at most 100 µm, in particular 5 µm, and is configured or designed to emit a primary radiation, in particular a blue primary radiation. The first sub-pixel 2 comprises a first conversion element 5 arranged on the first sub-pixel 2. The first conversion element 5 comprises a green phosphor, which is configured or designed to convert primary radiation in green radiation.

The second sub-pixel 3 comprises a second conversion element 6 arranged on the second sub-pixel 3. The second conversion element 6 comprises a red phosphor, which is configured or designed to convert primary radiation in red radiation. The third sub-pixel 4 is free of a conversion element and is configured or designed to emit blue primary radiation.

Figure 2:
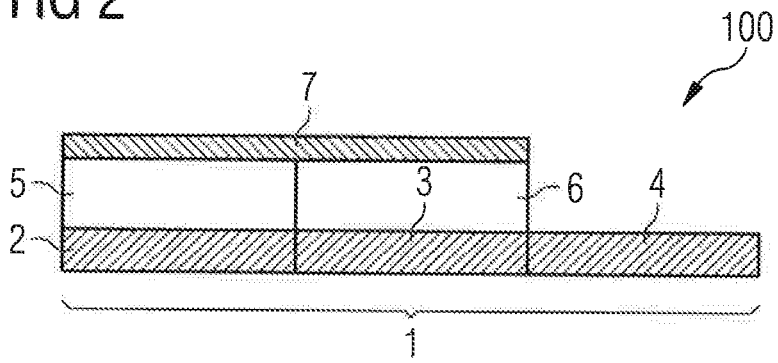

FIG. 2 shows the light-emitting device 100 of FIG. 1 with an additional absorption layer 7 arranged on the first conversion element 5 and the second conversion element 6. The absorption layer 7 comprises a material that absorbs at least blue radiation but is transmissive for green and/or red radiation. For example, the absorption layer can comprise nanoparticles like GaP or CdS nanoparticles.

Figure 3:
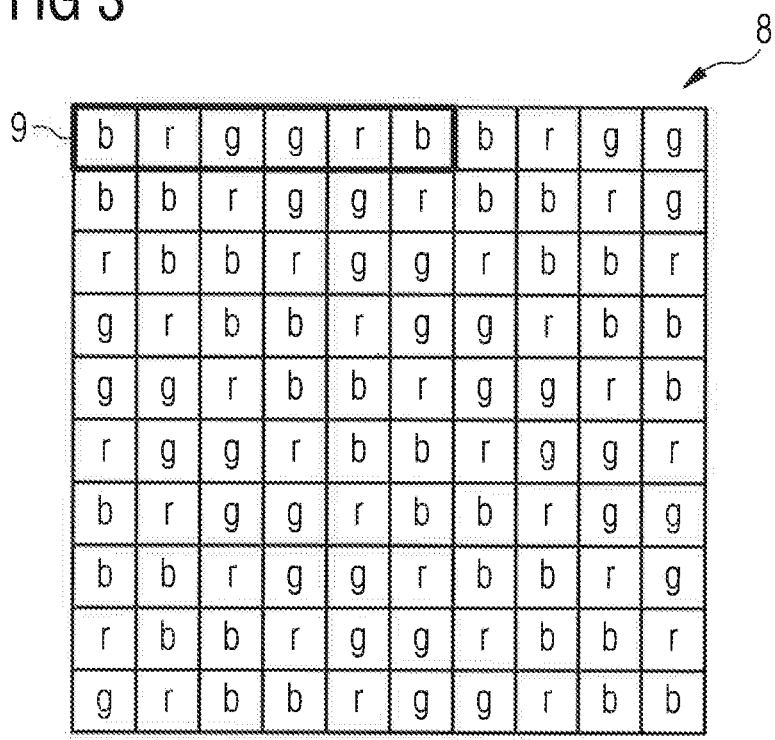
FIGS. 3 and 4 show ordered patterns of light-emitting devices and/or displays according to different embodiments.
Figure 4:
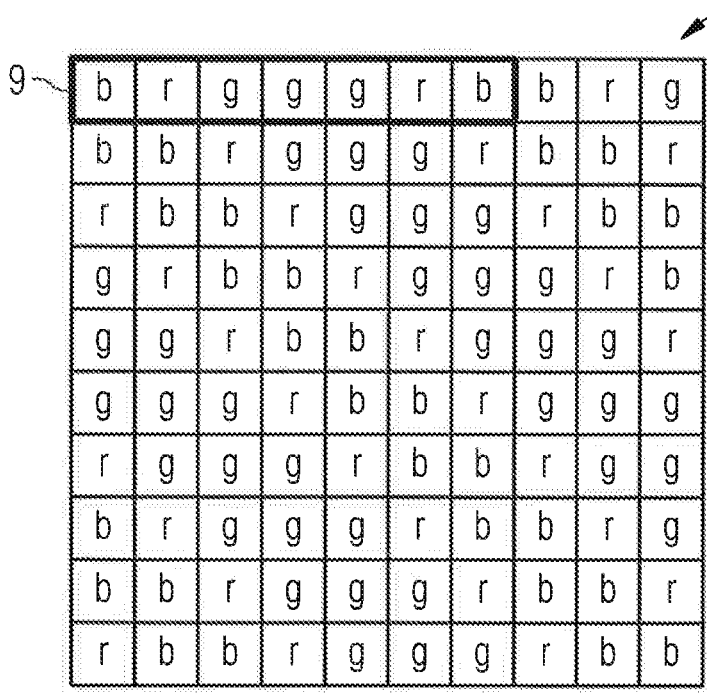

FIGS. 3 and 4 show two-dimensional ordered patterns 8 of a multiplicity of pixels comprising linear chains of sub-pixels as the repeat unit 9. In the horizontal and vertical extension direction of the two-dimensional ordered pattern, the linear repeat unit 9 is repeated in each row as well as in each column. In adjacent rows and columns, the repeat unit 9 is shifted one to the side or one in height to ensure ordered patterns in which a blue-emitting third sub-pixel (b) is never adjacent to green-emitting first sub-pixel (g). Since the red quantum dots of the conversion element of the red-emitting second sub-pixel (r) can be designed to not absorb green emission, crosstalk from green to red is not an issue. The only crosstalk to consider is that from blue to red, which is less problematic because of the high efficiency of red quantum dots.

As shown in FIG. 3 with the linear repeat unit brggrb, the ratio of blue, red and green sub-pixels within each pixel is the same. An ordered pattern can readily be extended to account for different ratios of blue, red and green sub-pixels as it is sometimes desired. As shown in FIG. 4 with the linear repeat unit brgggrb, the relative number of green sub-pixels is increased. Two-dimensional ordered patterns further minimize crosstalk and maximize color gamut.

Figure 5:
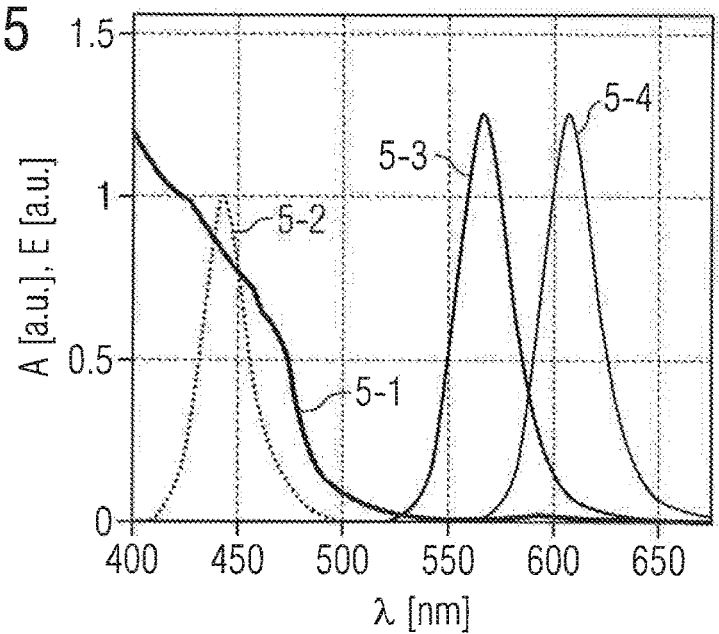
FIG. 5 shows absorption and emission curves of quantum dots according to one embodiment.

FIG. 5 shows the absorption (5-1) and emission (5-4) curves of red quantum dots as well as the emission curves of a blue LED (5-2) and green quantum dots (5-3). The y-axis shows the absorption A or the emission E in arbitrary units (a.u.) and the x-axis the wavelength λ in nm. The red quantum dots are, for example, quantum dots with a CdSe core and a CdS shell. The red quantum dots are absorptive to the radiation emitted by a blue LED (5-2), since the absorption curve 5-1 indicates a high absorption in the blue wavelength range. The red quantum dots, however, are not absorptive to the radiation emitted by the green quantum dots (5-3), since the absorption curve 5-1 shows no significant absorption in the green wavelength range. Red quantum dots that are absorptive to blue radiation but minimally absorptive to green radiation reduce crosstalk from green to red between adjacent sub-pixels and thus enhance the color gamut of the light-emitting device.

Figure 6:
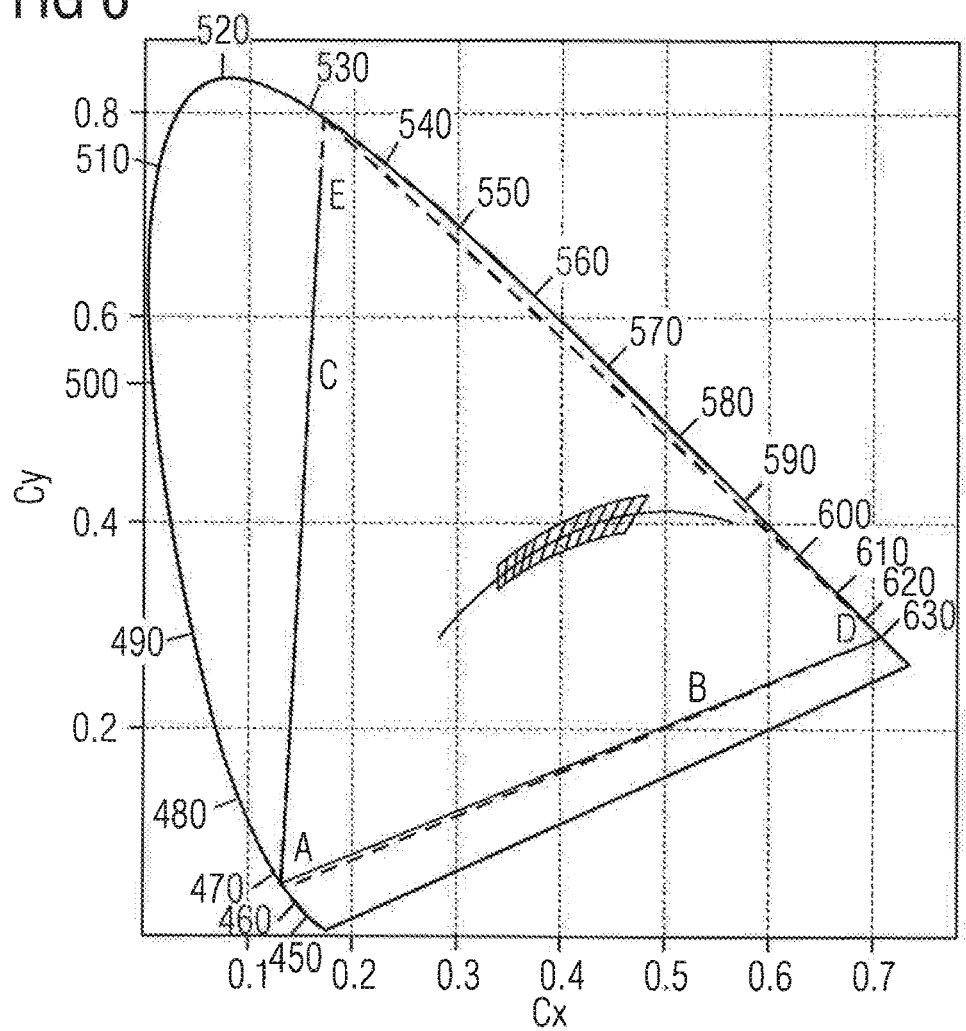
FIG. 6 shows a CIE diagram for explaining embodiments of light-emitting devices and/or displays.

FIG. 6 shows a CIE diagram with the Rec2020 gamut (dashed triangle) and the conversion of the blue LED by green quantum dots (line A-C-E) or red quantum dots (line A-B-D). As can be seen in FIG. 6, the ability of a converter system to match a gamut depends in part on the conversion efficiency. The line A-C-E represents all possible combinations of conversion and quantum efficiencies using typical green quantum dots. As the ratio of transmitted blue radiation to converted radiation decreases, the end of the line pushes further to the right (likewise for line A-B-D for red conversion). For example, the line A-C is the result of a poor conversion ratio achieved by either incomplete absorption or low quantum efficiency of the converter. The maximum gamut is covered by the triangle A-D-E resulting from both high quantum yield and high absorption.

Figure 7:
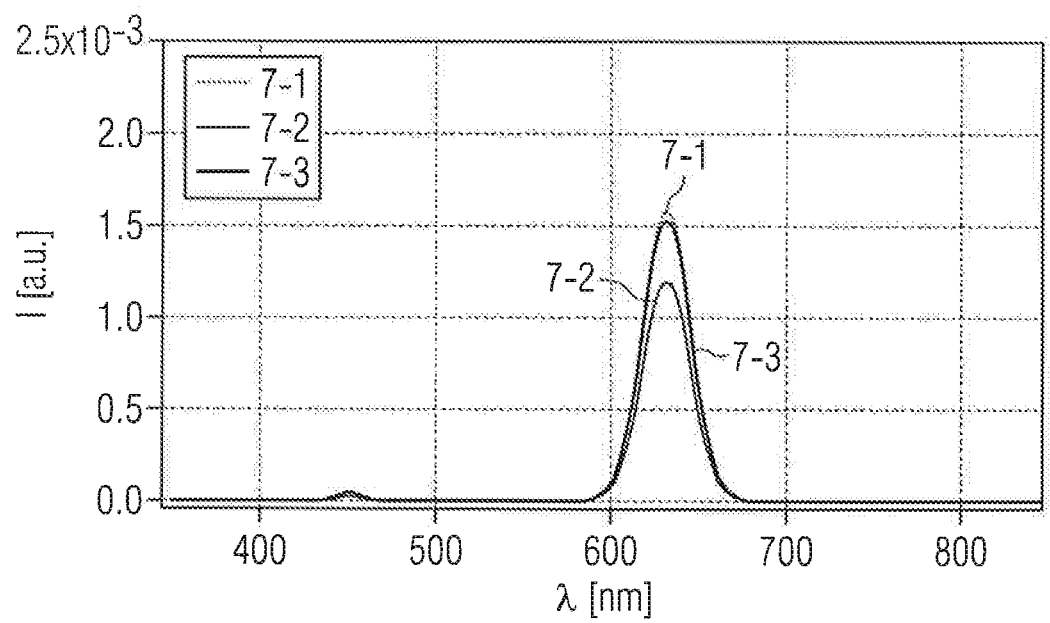
FIG. 7 shows emission curves of quantum dots according to different embodiments.

FIG. 7 shows emission curves of second sub-pixels for generating red radiation. The emission curves illustrate how the quantum efficiency influences the color-purity of the emitted radiation. The y-axis shows the intensity I in arbitrary units (a.u.) and the x-axis the wavelength λ in nm. The red quantum dots of emission curve 7-1 have an absorption of 99%, a quantum efficiency of 99% and a red:blue ratio of 112. The red quantum dots of emission curve 7-2 have an absorption of 99%, the quantum efficiency of 75% and a red:blue ratio of 85. The red quantum dots of emission curve 7-3 have an absorption of 98%, a quantum efficiency of 98% and a red:blue ratio of 55. The red:blue ratio is calculated from the intensities of the peaks at 630 nm (red) and 450 nm (blue) and thus illustrates the color-purity of the emitted radiation. The red:blue ratio gives an estimate of the color location on the line A-B-D in FIG. 6. A high red:blue ratio means a high amount of converted red radiation compared to transmitted blue radiation and thus a color location at the D-end of the line A-B-D in FIG. 6.

Figure 8:
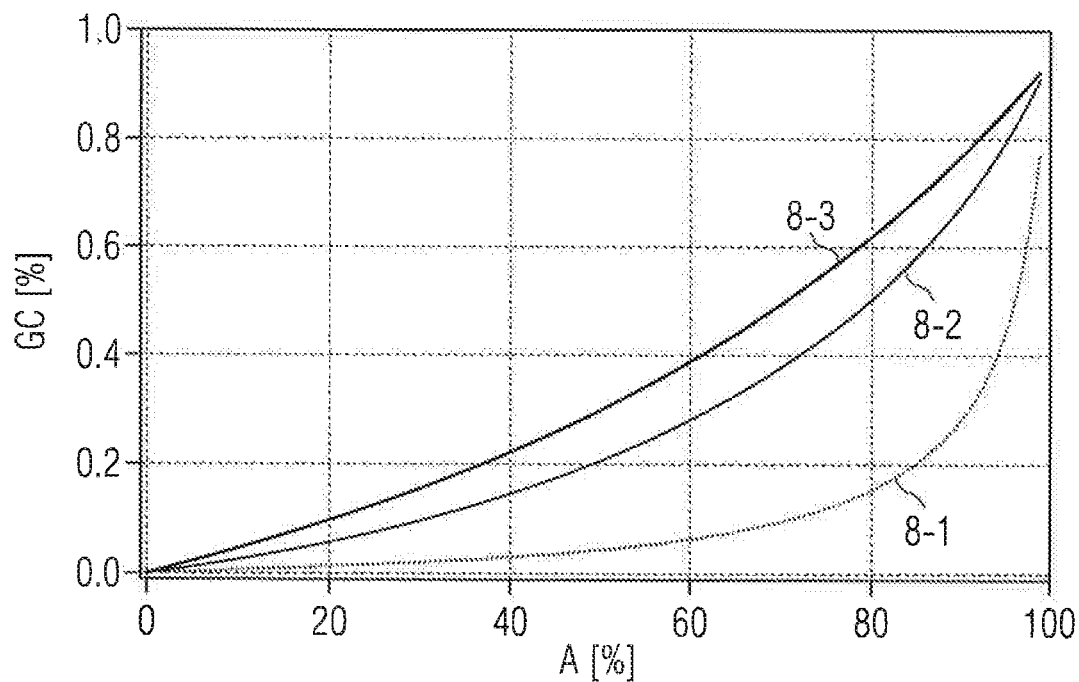
FIG. 8 shows the computational gamut coverage according to different embodiments.

FIG. 8 shows the computational Rec2020 gamut coverage of a light-emitting device using a blue LED with green and red quantum dots with typical emission linewidths. The y-axis shows the gamut coverage GC in percent and the x-axis the absorption of a red quantum dot in percent. For the calculation, the green quantum dots are assumed to have 100% absorption and 100% quantum efficiency while the absorption and the quantum efficiency of the red quantum dots are varied. The red quantum dots of curve 8-1 have a quantum efficiency of 10%, the red quantum dots of curve 8-2 have a quantum efficiency of 50% and the red quantum dots of curve 8-3 have a quantum efficiency of 100%. As can be seen, the gamut coverage increases significantly with increasing quantum efficiency, especially for an absorption of 40% to 80%.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

What is claimed is:

1. A light-emitting device comprising:
    a pixel comprising at least three sub-pixels;
    a first sub-pixel comprising a first conversion element, wherein the first conversion element comprises a green phosphor;
    a second sub-pixel comprising a second conversion element, wherein the second conversion element comprises a red phosphor;
    a third sub-pixel free of a conversion element, wherein the third sub-pixel is configured to emit blue primary radiation; and
    an absorption layer arranged on the first conversion element and/or the second conversion element,
    wherein the absorption layer is configured to absorb blue primary radiation,
    wherein the absorption layer is configured to absorb at least 90% of the blue radiation transmitted through the first and/or second conversion element,
    wherein each sub-pixel has an edge length of at most 100 μm, and wherein the light-emitting device is configured to enhance a gamut coverage of an emitted radiation.

2. The light-emitting device according to claim 1, wherein the red phosphor and/or the green phosphor comprises quantum dots.

3. The light-emitting device according to claim 1, wherein the first conversion element and/or the second conversion element has a thickness of at most 5 µm.

4. The light-emitting device according to claim 1, wherein the first conversion element and/or the second conversion element is free of non-converter nanoparticles.

5. The light-emitting device according to claim 1, wherein the absorption layer comprises nanoparticles absorptive to the blue primary radiation.

6. The light-emitting device according to claim 5, wherein the nanoparticles have a diameter of between at least 2 nm and at most 500 nm.

7. The light-emitting device according to claim 5, wherein the nanoparticles comprise a material selected from binary systems, ternary systems or alloy materials.

8. The light-emitting device according to claim 1, wherein the red phosphor comprises red quantum dots minimally absorptive to green radiation.

9. The light-emitting device according to claim 8, wherein the red quantum dots comprise a CdSe core and a CdS shell.

10. The light-emitting device according to claim 1, wherein the pixel is a repeat unit of a two-dimensional ordered pattern.

11. The light-emitting device according to claim 10, wherein the repeat unit of the two-dimensional ordered pattern is a linear chain of sub-pixels.

12. The light-emitting device according to claim 10, wherein a plurality of repeat units is arranged in the two-dimensional ordered pattern.

13. The light-emitting device according to claim 12, wherein the plurality of repeat units is arranged so that a first sub-pixel is never adjacent to a third sub-pixel in a vertical direction and in a horizontal extension direction of the two-dimensional ordered pattern.

14. The light-emitting device according to claim 10, wherein the repeat unit comprises an equal number n of first, second and third sub-pixels.

15. The light-emitting device according to claim 10, wherein the repeat unit comprises an equal number n of second and third sub-pixels and n+1 first sub-pixels.

16. The light-emitting device according to claim 1, wherein the light-emitting device is at least part of a display.

17. A light-emitting device comprising:
a pixel comprising at least three sub-pixels;
a first sub-pixel comprising a first conversion element, wherein the first conversion element comprises a green phosphor;
a second sub-pixel comprising a second conversion element, wherein the second conversion element comprises red quantum dots minimally absorptive to green radiation; and
a third sub-pixel free of a conversion element, wherein the third sub-pixel is configured to emit blue primary radiation,
wherein each sub-pixels has an edge length of at most 100 µm,
wherein the pixel is a linear chain of sub-pixels and a plurality of pixels is arranged in a two dimensional ordered pattern so that a first sub-pixel is never adjacent to a third sub-pixel in a vertical direction and in a horizontal extension direction of the ordered pattern,
wherein the pixel is a repeat unit of the two-dimensional ordered pattern, and
wherein the repeat unit comprises an equal number n of second and third sub-pixels and n+1 first sub-pixels.

18. The light-emitting device according to claim 17, further comprising an absorption layer arranged on the first conversion element and/or the second conversion element, wherein the absorption layer is configured to absorb blue primary radiation.

19. The light-emitting device according to claim 18, wherein the absorption layer has a thickness of at most 2 µm.

20. A light-emitting device comprising:
a pixel comprising at least three sub-pixels;
a first sub-pixel comprising a first conversion element, wherein the first conversion element comprises green quantum dots;
a second sub-pixel comprising a second conversion element, wherein the second conversion element comprises red quantum dots minimally absorptive to green radiation;
a third sub-pixel free of a conversion element, wherein the third sub-pixel is configured to emit blue primary radiation; and
an absorption layer arranged on the first conversion element and/or the second conversion element,
wherein each sub-pixel has an edge length of at most 100 µm, and
wherein the first conversion element and the second conversion element have a thickness of at most 2 µm.

* * * * *